(12) United States Patent
Huang et al.

(10) Patent No.: US 8,853,090 B1
(45) Date of Patent: Oct. 7, 2014

(54) METHOD FOR FABRICATING A THROUGH-SILICON VIA

(71) Applicant: IPEnval Consultant Inc., Hsinchu (TW)

(72) Inventors: Chao-Yuan Huang, Hsinchu (TW); Yueh-Feng Ho, Hsinchu (TW); Ming-Sheng Yang, Hsinchu (TW); Hwi-Huang Chen, Hsinchu (TW)

(73) Assignee: IPEnval Consultant Inc., Hsinchu (TW)

( * ) Notice: Subject to any disclaimer, the term of this patent is extended or adjusted under 35 U.S.C. 154(b) by 0 days.

(21) Appl. No.: 13/832,930

(22) Filed: Mar. 15, 2013

(51) Int. Cl.
*H01L 21/311* (2006.01)
*H01L 21/768* (2006.01)

(52) U.S. Cl.
CPC .............................. *H01L 21/76846* (2013.01)
USPC .... 438/700; 438/513; 438/680; 257/E21.006; 257/E21.091; 257/E21.17; 257/E21.023; 257/E21.249; 257/E21.319; 257/E21.55; 257/E21.577; 257/E21.586

(58) Field of Classification Search
USPC ......... 438/700, 311, 513, 514, 680, 683, 687, 438/775; 257/E21.006, E21.023, E21.091, 257/E21.17, E21.249, E21.319, E21.55, 257/E21.577, E21.586
See application file for complete search history.

(56) References Cited

U.S. PATENT DOCUMENTS

| 7,843,072 | B1 * | 11/2010 | Park et al. ...................... 257/774 |
| 8,039,386 | B1 | 10/2011 | Dao et al. |
| 8,168,533 | B2 * | 5/2012 | Kuo .............................. 438/667 |
| 8,269,316 | B2 * | 9/2012 | Kuo et al. ...................... 257/621 |
| 8,519,542 | B2 * | 8/2013 | Kim et al. ...................... 257/774 |
| 2009/0289324 | A1 | 11/2009 | Goodlin et al. |
| 2012/0190188 | A1 | 7/2012 | Zhao et al. |

* cited by examiner

*Primary Examiner* — David Nhu
(74) *Attorney, Agent, or Firm* — Alan Kamrath; Kamrath IP Lawfirm, P.A.

(57) ABSTRACT

A method for fabricating a through-silicon via comprises the following steps. Provide a substrate. Form a through silicon hole in the substrate having a diameter of at least 1 μm and a depth of at least 5 μm. Perform a first chemical vapor deposition process with a first etching/deposition ratio to form a dielectric layer lining the bottom and sidewall of the through silicon hole and the top surface of the substrate. Perform a shape redressing treatment with a second etching/deposition ratio to change the profile of the dielectric layer. Repeat the first chemical vapor deposition process and the shape redressing treatment at least once until the thickness of the dielectric layer reaches to a predetermined value.

20 Claims, 6 Drawing Sheets

METHOD FOR FABRICATING A THROUGH-SILICON VIA

FIELD OF THE INVENTION

The present invention relates to a method for fabricating a through-silicon via.

BACKGROUND OF THE INVENTION

To save precious layout space or increase interconnection efficiency, multiple chips of integrated circuits (ICs) can be stacked together as a single IC package. To that end, a three-dimensional (3D) stack packaging technology is used to package the chips of integrated circuits. Through-silicon vias (TSVs) are widely used to accomplish the 3D stack packaging technology. A through-silicon via is a vertical conductive via completely passing through a silicon wafer, a silicon board, a substrate of any material or die. Nowadays, a 3D integrated circuit (3D IC) is applied to a lot of fields such as memory stacks, image sensors or the like.

Unlike traditional integrated circuits, a through silicon via comes with a size of hundred fold or more. It would not be difficult to imagine a manufacturing designed for fabricating traditional integrated circuits may not satisfy every requirement needed for fabricating through silicon vias. Therefore, there is a need to modify the traditional manufacturing method for through-silicon vias so through-silicon vias can also be fabricated without a problem.

SUMMARY OF THE INVENTION

A purpose of this invention is to provide a method for fabricating a through-silicon via comprising the following steps. Provide a substrate. Form a through silicon hole in the substrate having a diameter of at least 1 µm and a depth of at least 5 µm. Perform a first chemical vapor deposition process with a first etching/deposition ratio to form a dielectric layer lining the bottom and sidewall of the through silicon hole and the top surface of the substrate. Perform a shape redressing treatment with a second etching/deposition ratio to change the profile of the dielectric layer. Repeat the first chemical vapor deposition process and the shape redressing treatment at least once until the thickness of the dielectric layer reaches to a predetermined value.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The following is the detailed description of the preferred embodiments of this invention. All the elements, sub-elements, structures, materials, arrangements recited herein can be combined in any way and in any order into new embodiments, and these new embodiments should fall in the scope of this invention defined by the appended claims. A person skilled in the art, upon reading this invention, should be able to modify and change the elements, sub-elements, structures, materials, arrangements recited herein without being apart from the principle and spirit of this invention. Therefore, these modifications and changes should fall in the scope of this invention defined only by the following claims.

There are a lot of embodiments and figures in this application. To avoid confusions, similar components are represented by same or similar numerals. To avoid complexity and confusions, only one of the repetitive components is marked. Figures are meant to deliver the principle and spirits of this invention, so the distance, size, ratio, shape, connection relationship, etc. are examples instead of realities. Other distance, size, ratio, shape, connection relationship, etc. capable of achieving the same functions or results can be adopted as equivalents.

Figure 1:
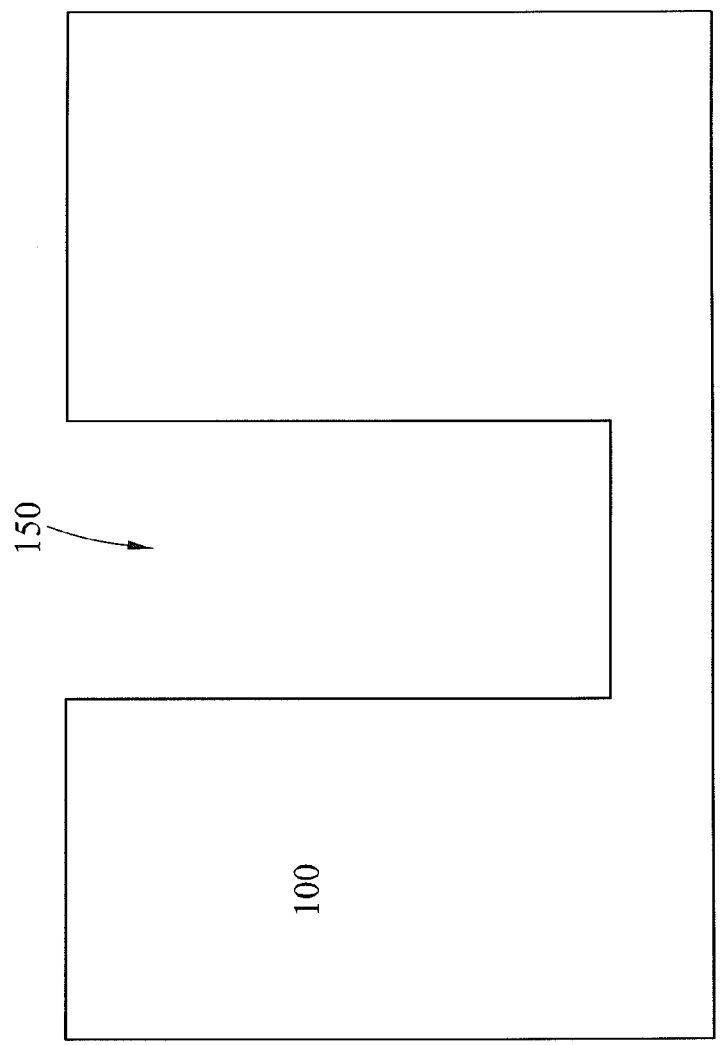
FIGS. 1-6 show a manufacturing process of a through-silicon via (TSV) in accordance with an embodiment of the present invention.

Now refer to FIGS. 1-6, which show a manufacturing process of a through-silicon via (TSV) in accordance with an embodiment of the present invention. In FIG. 1, a substrate 100 is provided and a through-silicon hole 150 is formed within the substrate 100 from the front side without penetrating the whole substrate 100. The substrate 100 may be a simple silicon substrate or a silicon on insulator substrate, or substrate 100 may comprise shallow trench isolation structures, passive devices such as resistors, every kinds of doped regions, dummy patterns and optional active devices (if follows a via middle process). The through-silicon hole 150 can be formed by photolithography and etching processes. The through-silicon hole 150 is configured to form a through-silicon via (TSV). The TSV (after its completion) passes "through" the substrate 100 and physically and electrically connect the backside and front side of substrate 100. The TSV is configured to couple operation voltage VSS, VDD or operational signal to the integrated circuits (not shown) formed on the substrate 100, or configured to transfer signals and/or voltages between chips. Compared to normal active devices such as transistors, TSV has a much bigger size in a scale of micrometers. In one embodiment, the through-silicon hole 150 has a diameter of 30 µm and a depth of 100 µm. In another embodiment, the through-silicon hole 150 has a diameter of 10 µm and a depth of 30 µm. In a further embodiment, the through-silicon hole 150 has a diameter equivalent or larger than at least 1 µm such as 6 µm and a depth equivalent or larger than 5 µm such as 10 µm.

Figure 2:
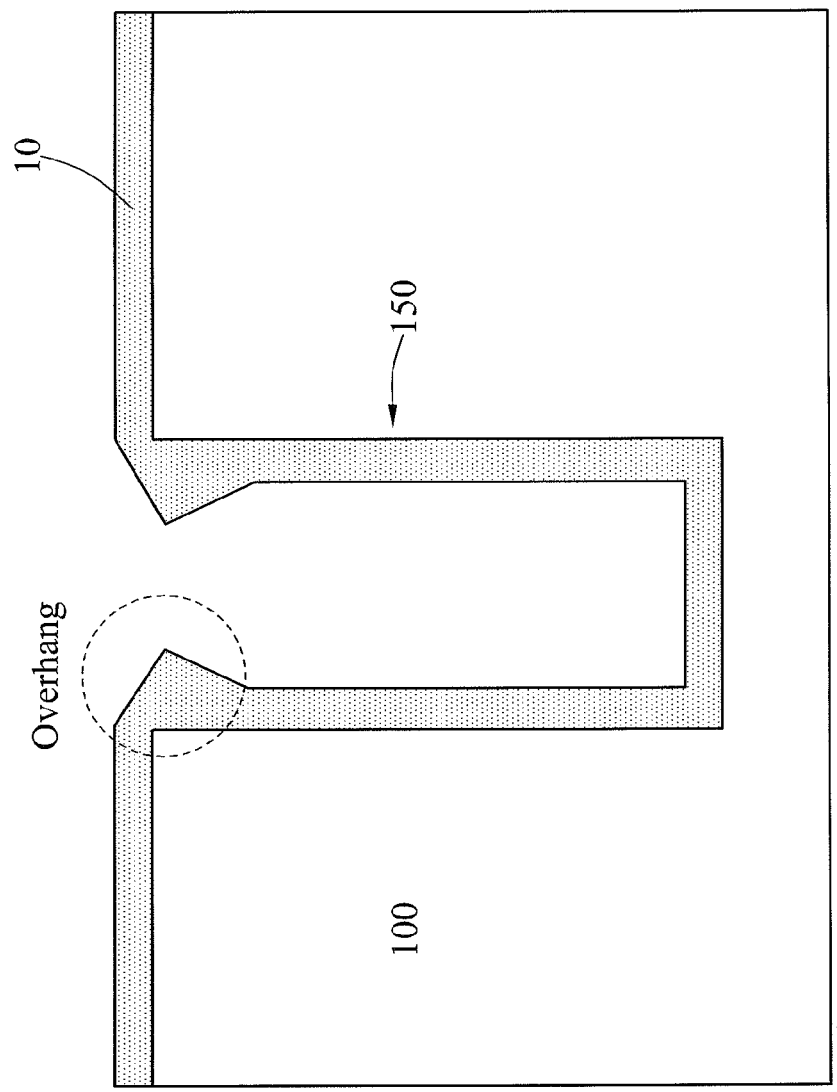

Next refer to FIG. 2, a dielectric layer 10 is formed lining the sidewall and bottom of the through-silicon hole 150 and the front surface of the substrate 100. The dielectric layer 10 can be formed by a high density plasma chemical vapor deposition (HDPCVD) process with first etching/deposition ratio to a first thickness. The dielectric layer 151 may comprise the most commonly used dielectric materials silicon oxide and/or silicon nitride. The step coverage of a CVD-formed layer depends on arriving angle and surface mobility of the precursors used in the CVD process. Basically bigger arriving angle leads to less step coverage, thereby less thickness uniformity and less conformity. Since the corner of the through-silicon hole 150 has the biggest arriving angle, an overhang of the dielectric layer 10 is formed at the corner of the through-silicon hole 150.

Figure 3:
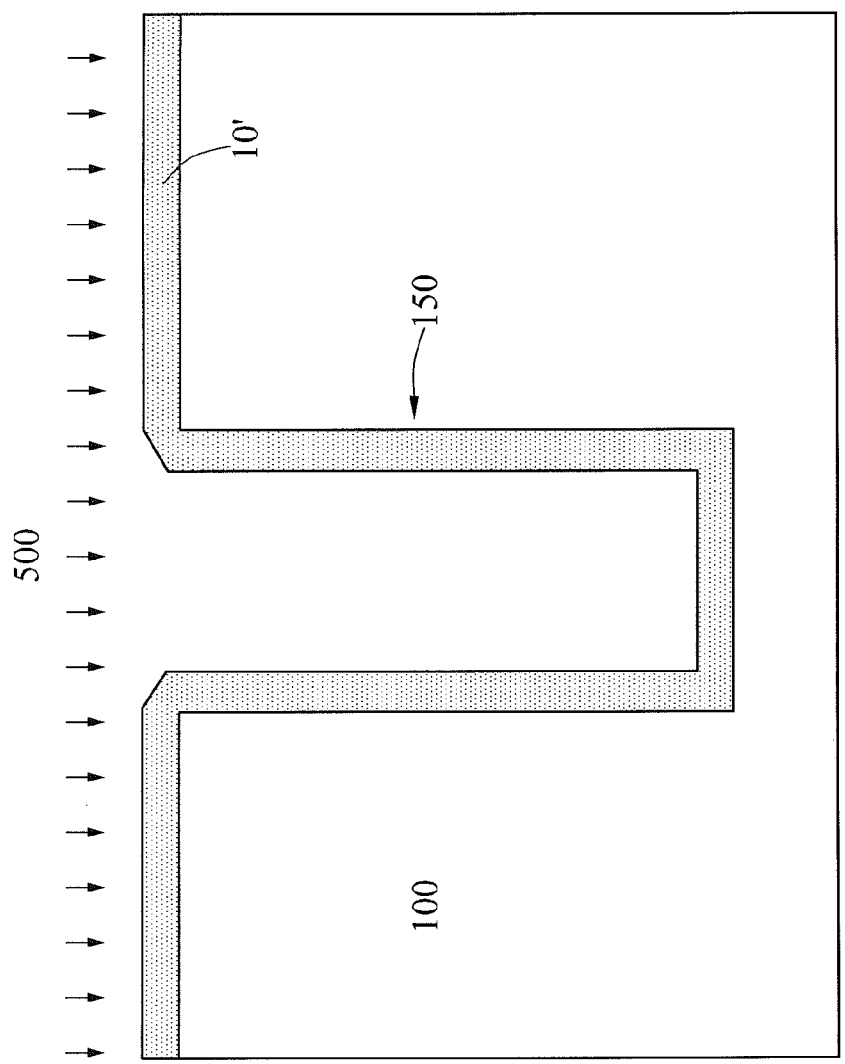

Next refer to FIG. 3, a shape-redressing treatment 500 is performed on the dielectric layer 10. This shape-redressing treatment 500 can also be a high density plasma chemical vapor deposition (HDPCVD) process but with second etching/deposition ratio, wherein the first etching/deposition ratio is smaller than the second etching/deposition ratio. Or, this shape-redressing treatment 500 is a sputtering process or etching process. If the shape-redressing treatment 500 is a HDPCVD process, the thickness of the dielectric layer 10 would be slightly increased after this process and this process can be performed in the same chamber as the HDPCVD process described with respect to FIG. 2 (that is they are performed in-situly). If the shape-redressing treatment 500 is a sputtering process or etching process, the thickness of the dielectric layer 10 would be slightly decreased and this shape-redressing treatment 500 and the HDPCVD process described with respect to FIG. 2 can be performed in different chambers (that is ex-situly) or in the same main frame without breaking vacuum. It is worth mentioning that non-oxygen containing species may be used during the sputtering process or etching process to generate plasma or ions and as a result the surface of dielectric layer 10 exposing thereto may be modified or altered to contain some atoms from plasma or ions. In one embodiment, nitrogen-containing or fluorine-containing species may be used to generate plasma or ions during the sputtering or etching and the surface of dielectric layer 10 exposing thereto may tend to contain nitrogen or fluorine atoms. For example, the nitrogen-containing species may be selected from $N_2O$, $NO$, $N_2$, $NH_3$, $NF_3$ and their random combinations and the fluorine-containing species may be selected from $CF_4$, $CHF_3$, $SF_6$, $CH_2F_2$ and their random combinations. Aside from the nitrogen-containing species and/or fluorine-containing species, inert gases such as Ar and He may also be used to increase physical bombard effect during shape-redressing treatment. After the shape-redressing treatment 500, the overhang of the dielectric layer 10 at the corner of the through-silicon hole 150 should be improved or completely eliminated, so a predetermined profile of the dielectric layer 10' is achieved.

If the overhang is not completely eliminated, the processes described with respect to FIGS. 2 and 3 (dielectric-layer-forming process and shape-redressing treatment) as a cycle can be performed repeatedly until the thickness of the dielectric layer 10' reaches its predetermined value ranging from at least 100 nm to several hundreds nm or the overhang is completely gone. By repeating said cycle (dielectric-layer-forming process and shape-redressing treatment) several times, the obtained dielectric layer 10' may have interfaces of nitrogen or fluorine distributions along its thickness direction. Overhang may not look big compared to the through-silicon hole 150, but overhang at the corner of the through-silicon hole 150 may induce void problem during material filling process. A void in a TSV will become a reliability weak point and cause electronic malfunctions.

Figure 4:
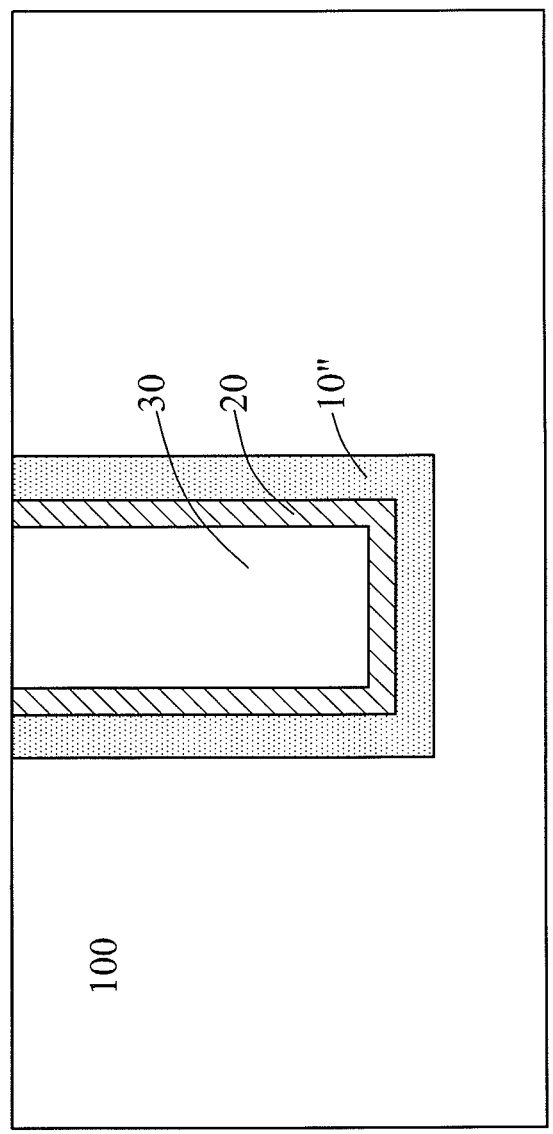

Next refer to FIG. 4, a barrier/glue/seed layer is formed on the dielectric layer 10' and a low-resistivity material is formed on the barrier/glue/seed layer filling the through-silicon hole 150. Then a planarization process such as a chemical mechanical polishing process is performed to remove excess dielectric layer 10', barrier/glue/seed layer and low-resistivity material, to form a global flat surface and to form planarized dielectric layer 10", planarized barrier/glue/seed layer 20 and planarized low-resistivity material 30. The term "barrier/glue/seed layer" means a barrier layer and/or a glue layer and/or a seed layer. The processes used to form the barrier/glue/seed layer is similar to the processes used to form the dielectric layer 10 but with a physical vapor deposition (PVD) in stead of a chemical vapor deposition. That is, the barrier/glue/seed layer is formed by the following way: first using a first PVD process with no bias to form a layer of barrier/glue/seed layer; then using a second PVD process with bias to remove overhang formed at the corner of the through-silicon hole 150, after this step the thickness will be slightly increased; and repeating the first and second PVDs alternatively until the barrier/glue/seed layer reaches its predetermined thickness or overhang is completely removed. It is worth noticing that barrier, glue and seed layers may comprise different materials. So, each of them may require a different target and independent PVD process cycles (first PVD for barrier layer→second PVD for barrier layer→first PVD for barrier layer→second PVD for barrier layer . . . ; first PVD for glue layer→second PVD for glue layer→first PVD for glue layer→second PVD for glue layer . . . ; first PVD for seed layer→second PVD for seed layer→first PVD for seed layer→second PVD for seed layer . . . ). The low-resistivity material may be formed by CVD process, electrode plating process or spin coating process. The barrier/glue/seed layer may comprise materials such as Ta, TaN, Ti, TiN, W, WN, Mo, Mn, Cu and a low-resistivity material may comprise W, Cu or Al. In a preferred embodiment, the barrier layer is TiN and/or Ti, the seed layer is Cu and the low-resistivity material is also Cu.

Figure 5:
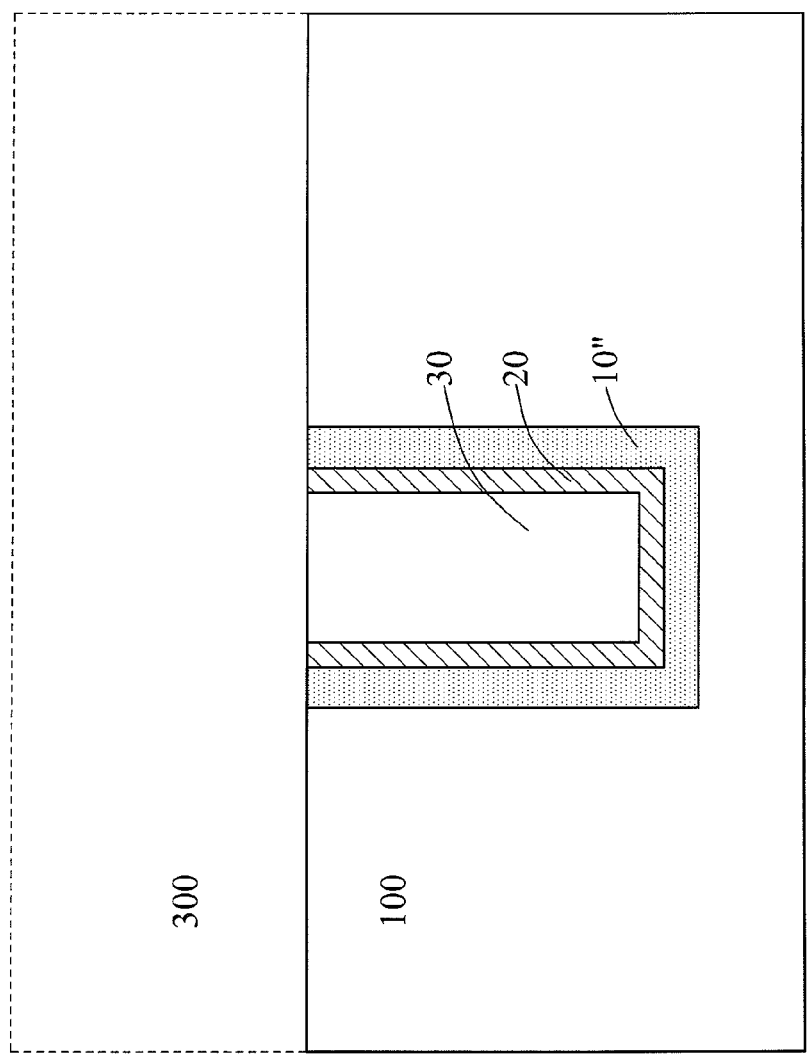

Next refer to FIG. 5, a device/interconnect layer 300 is formed on the substrate 100, planarized dielectric layer 10", planarized barrier/glue/seed layer 20 and planarized low-resistivity material 30. The device/interconnect layer 300 represents all the optional active devices, inter-layer dielectric layer and contacts (if a via first process is adopted) and inter-metal dielectric layers and all the interconnect structures embedded within.

Figure 6:
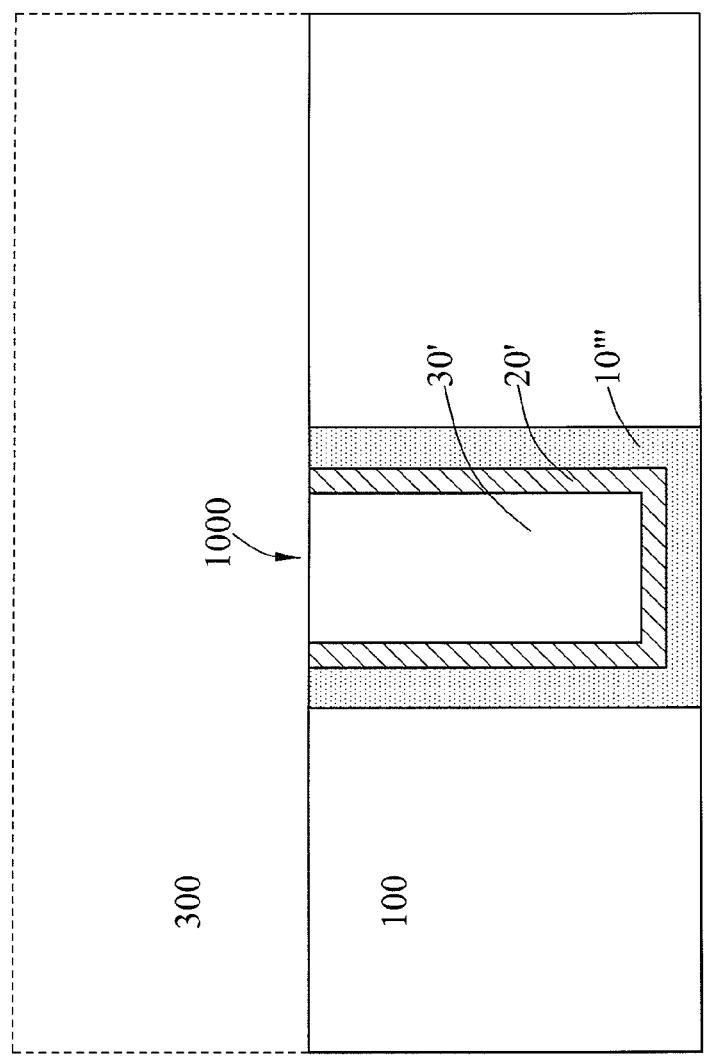

Next refer to FIG. 6, a backside grinding/polishing/thinning is performed in order to expose the low-resistivity material and barrier/glue/seed layer and to complete the TSV 1000 comprising a dielectric layer 10''', barrier/glue/seed layer 20' and conductive material 30'.

The TSV 1000 manufactured by the present invention would not suffer from overhang (hence void) problem, so its reliability can be improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a through-silicon via, comprising:
   providing a substrate;
   forming a through silicon hole in the substrate having a diameter of at least 1 µm and a depth of at least 5 µm;
   performing a first chemical vapor deposition process with a first etching/deposition ratio to form a dielectric layer lining a bottom and a sidewall of the through silicon hole and a top surface of the substrate;
   performing a shape redressing treatment with a second etching/deposition ratio to change the profile of the dielectric layer; and
   repeating the first chemical vapor deposition process and the shape redressing treatment at least once until a thickness of the dielectric layer reaches to a predetermined value.

2. The method for fabricating a through-silicon via of claim 1, wherein the first chemical vapor deposition is a high plasma density chemical vapor deposition.

3. The method for fabricating a through-silicon via of claim 2, wherein the shape redressing treatment is a high plasma density chemical vapor deposition.

4. The method for fabricating a through-silicon via of claim 3, wherein the first chemical vapor deposition and the shape redressing treatment are performed in-situly.

5. The method for fabricating a through-silicon via of claim 2, wherein the shape redressing treatment is a sputtering process or an etching process.

6. The method for fabricating a through-silicon via of claim 5, wherein the first chemical vapor deposition and the sputtering process or etching process are performed ex-situly.

7. The method for fabricating a through-silicon via of claim 5, wherein the first chemical vapor deposition and the sputtering process or etching process are performed without breaking vacuum.

8. The method for fabricating a through-silicon via of claim 5, wherein the sputtering process or etching process uses a nitrogen-containing species.

9. The method for fabricating a through-silicon via of claim 8, the sputtering process or etching process further uses an inert gas.

10. The method for fabricating a through-silicon via of claim 9, wherein the nitrogen-containing species is selected from $N_2O$, $NO$, $N_2$, $NH_3$, $NF_3$ and their random combinations.

11. The method for fabricating a through-silicon via of claim 5, wherein the sputtering process or etching process uses fluorine-containing species.

12. The method for fabricating a through-silicon via of claim 11, wherein the sputtering process or etching process further uses an inert gas.

13. The method for fabricating a through-silicon via of claim 12, wherein the fluorine-containing species is selected from $CF_4$, $CHF_3$, $SF_6$, $CH_2F_2$ and their random combinations.

14. The method for fabricating a through-silicon via of claim 1, further comprising, after the repeating step, forming a barrier layer on the dielectric layer by a first physical vapor deposition without bias and a second physical vapor deposition with bias.

15. The method for fabricating a through-silicon via of claim 14, further comprising forming a seed layer on the barrier layer by a third physical vapor deposition without bias and a fourth physical vapor deposition with bias.

16. The method for fabricating a through-silicon via of claim 1, further comprising, after the repeating step, forming a seed layer by a first physical vapor deposition without bias and a second physical vapor deposition with bias.

17. The method for fabricating a through-silicon via of claim 15, wherein the barrier layer comprise TiN and/or Ti and the seed layer comprises Cu.

18. The method for fabricating a through-silicon via of claim 1, further comprising, after the repeating step, forming a low-resistivity material filling the through silicon hole.

19. The method for fabricating a through-silicon via of claim 18, wherein the low-resistivity material is Cu.

20. The method for fabricating a through-silicon via of claim 15, further comprising forming a low-resistivity material on the seed layer to fill the through silicon hole.

* * * * *